United States Patent [19]
Watanabe

[11] Patent Number: 5,274,596
[45] Date of Patent: Dec. 28, 1993

[54] DYNAMIC SEMICONDUCTOR MEMORY DEVICE HAVING SIMULTANEOUS OPERATION OF ADJACENT BLOCKS

[75] Inventor: Yohji Watanabe, Kawasaki, Japan

[73] Assignee: Kabushiki Kaisha Toshiba, Kawasaki, Japan

[21] Appl. No.: 7,012

[22] Filed: Jan. 21, 1993

Related U.S. Application Data

[63] Continuation of Ser. No. 617,930, Nov. 26, 1990, abandoned, which is a continuation of Ser. No. 244,804, Sep. 15, 1988, abandoned.

[30] Foreign Application Priority Data

Sep. 16, 1987 [JP] Japan ................................. 62-231906

[51] Int. Cl.$^5$ ............................ G11C 7/00; G11C 8/00
[52] U.S. Cl. ................................. 365/203; 365/230.03; 365/233
[58] Field of Search ................... 365/203, 230.03, 239, 365/221, 233

[56] References Cited

U.S. PATENT DOCUMENTS

| | | | |
|---|---|---|---|
| 4,106,109 | 8/1979 | Fassbender | 365/221 |
| 4,354,256 | 10/1982 | Miyasaka | 365/230.03 |
| 4,379,342 | 4/1983 | Nakano et al. | 365/230.03 |
| 4,386,421 | 5/1983 | Inagaki | 365/230.09 |
| 4,581,721 | 4/1986 | Gunawardawa | 365/230.09 |
| 4,636,982 | 1/1987 | Takemae et al. | 365/230.03 |
| 4,773,048 | 9/1988 | Kai | 365/230.03 |
| 4,796,222 | 1/1989 | Aicheiman, Jr. et al. | 365/230.03 |
| 4,802,132 | 1/1989 | Ohsawa | 365/230.03 |
| 4,839,868 | 6/1989 | Sato et al. | 365/233 |

FOREIGN PATENT DOCUMENTS

| | | | |
|---|---|---|---|
| 58058 | 3/1986 | Japan | 365/230.03 |
| 0112292 | 5/1987 | Japan | 365/230.03 |

*Primary Examiner*—Joseph L. Dixon
*Assistant Examiner*—Michale A. Whitfield
*Attorney, Agent, or Firm*—Oblon, Spivak, McClelland, Maier & Neustadt

[57] ABSTRACT

A dynamic semiconductor device includes a plurality of dynamic memory cell arrays each having memory cells arranged in a matrix form, row decoders connected to the plurality of memory cell arrays, respectively, sense amplifiers connected to the plurality of memory cell arrays, respectively, a plurality of bit lines connected to the each of the plurality of memory cell arrays, for exchanging data with the memory cells arranged in the matrix form, the plurality of bit lines being connected to a corresponding one of the sense amplifiers, a plurality of word lines, intersecting the plurality of bit lines, for selecting the memory cells, the word lines selected by row addresses adjacent on a logical address plane being located in adjacent ones of the memory cell arrays, the word lines within the each memory cell array being selected by an upper row address of a row address output from a corresponding one of the row decoders, and means for selecting the memory cell arrays by a lower row address of the row address, the selecting means raising a plurality of given word lines selected by the addresses adjacent to a row address corresponding to any word line and enabling corresponding ones of the sense amplifiers of the memory cell arrays including the given word lines when the memory cells on the any word line are to be accessed.

7 Claims, 6 Drawing Sheets

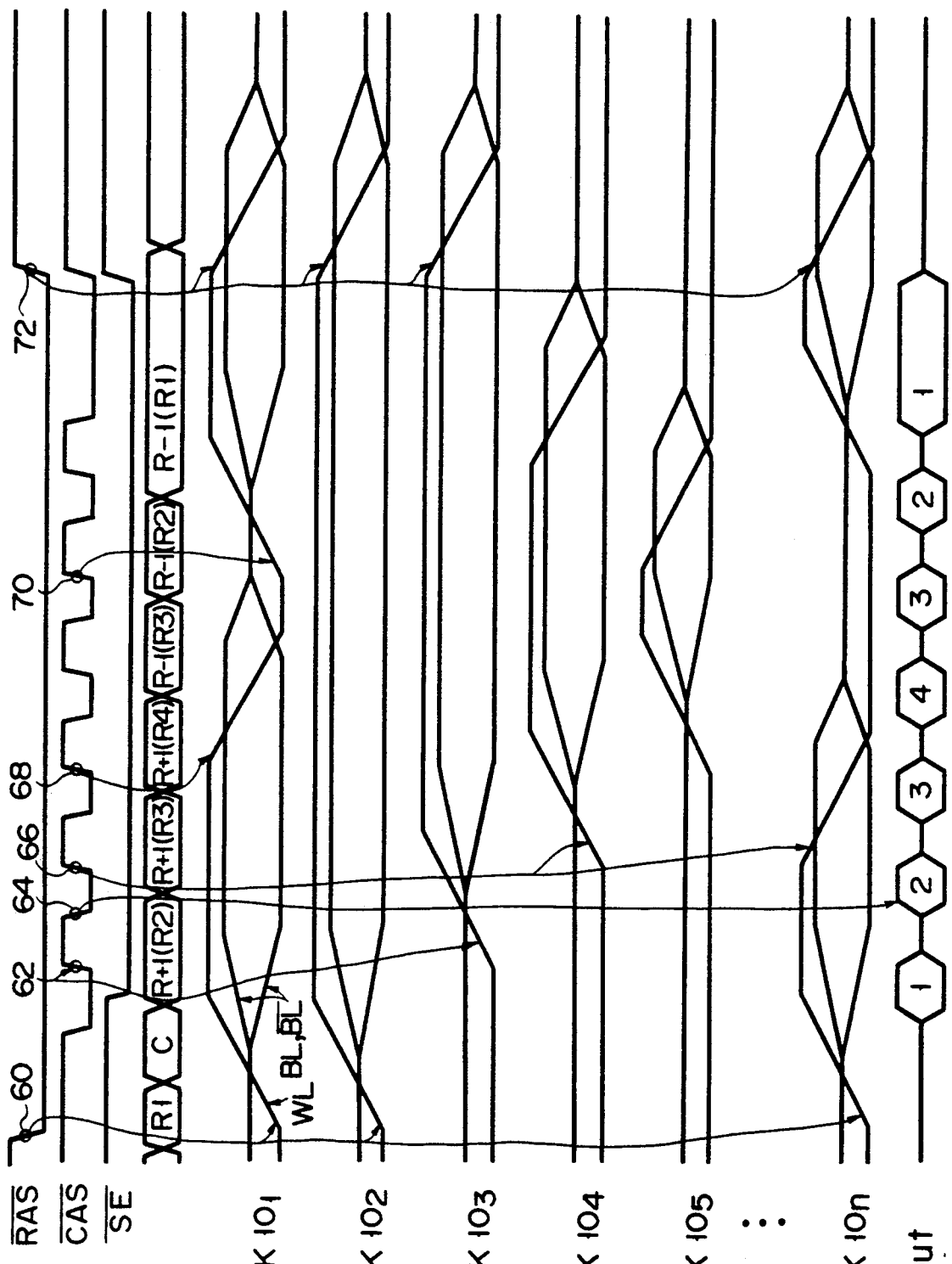
F I G. 3

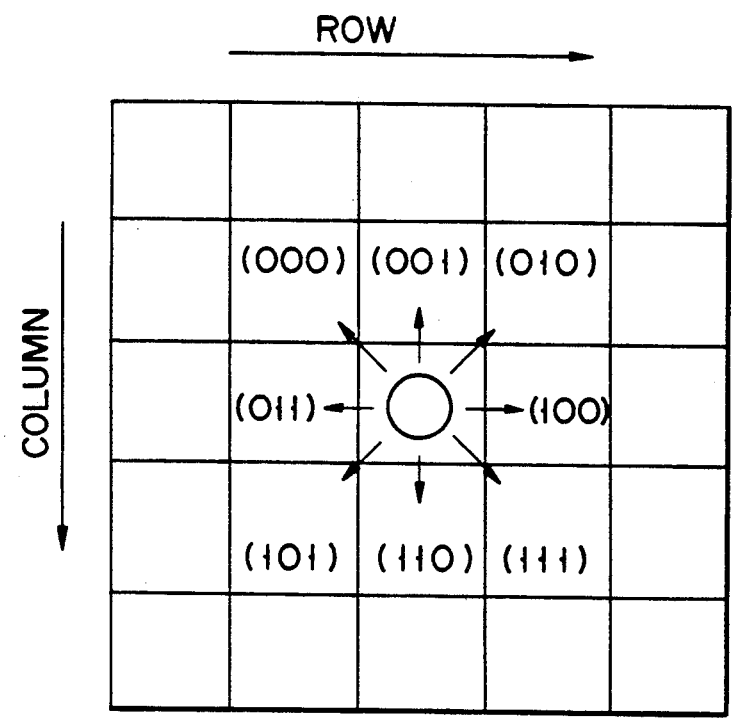
F I G. 4

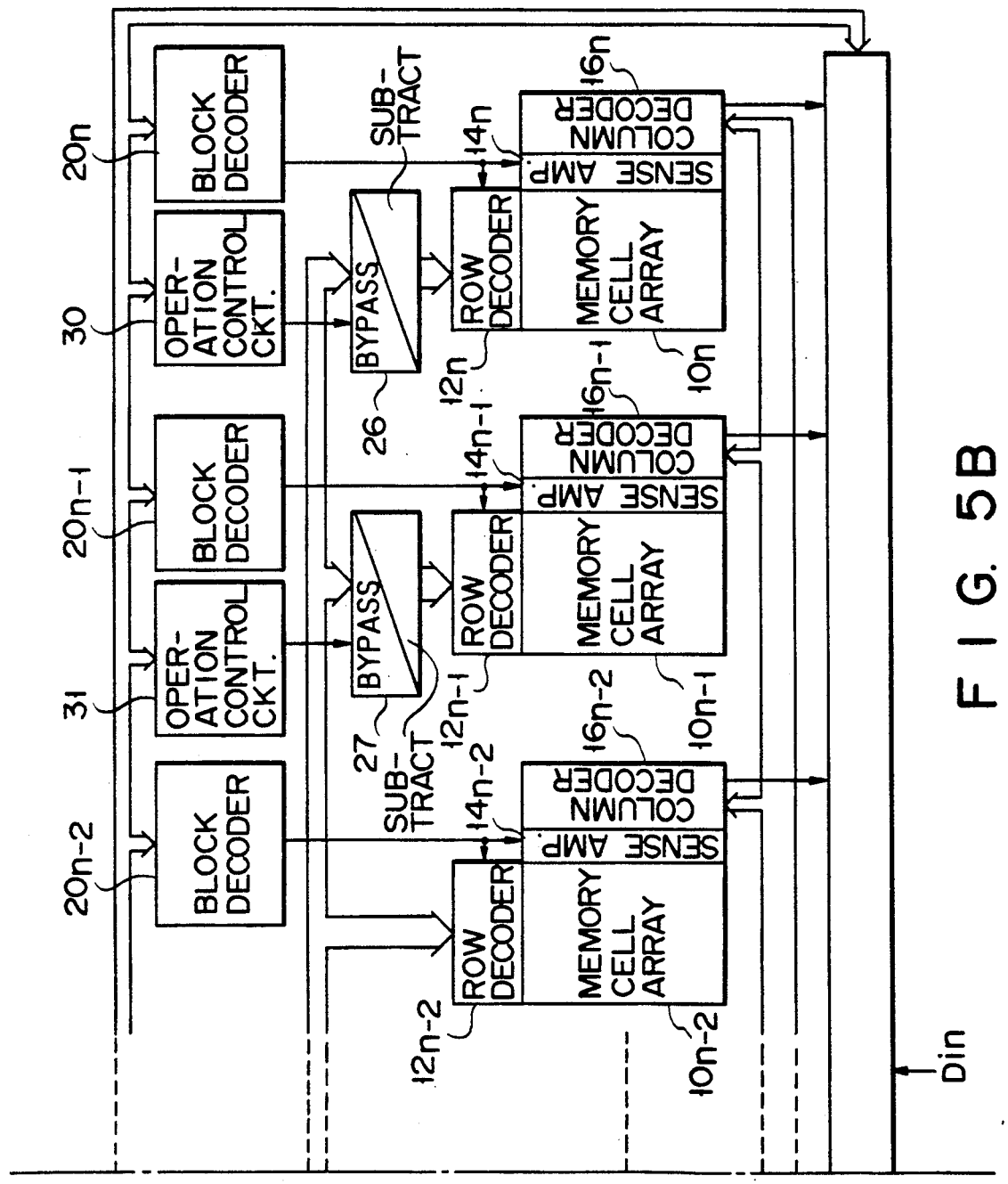
F I G. 5B

DYNAMIC SEMICONDUCTOR MEMORY DEVICE HAVING SIMULTANEOUS OPERATION OF ADJACENT BLOCKS

This application is a continuation of application Ser. No. 07/617,930 filed on Nov. 26, 1990 now abandoned, which is a continuation of Ser. No. 07/244,804 filed Sep. 15, 1988 both now abandoned.

BACKGROUND OF THE INVENTION

1. Field of the Invention

The present invention relates to a dynamic semiconductor memory device having a high-speed access function.

2. Description of the Related Art

In recent years, techniques for digitally processing an image signal have been rapidly developed in computer graphics, pattern recognition, home television receivers, and VTRs. With the development, an image memory IC for storing image information has been required to have a higher-speed access function.

A page mode, a static column mode, a nibble mode, and the like are known as functions of a dynamic RAM (to be referred to as a dRAM) having a high-speed access function. In addition, a dRAM having a high-speed serial access function is recently announced. In the dRAM, a shift register for a parallel/serial conversion of a signal is arranged between a memory array and an external I/O buffer. Therefore, serial data can be input/output within a short cycle.

The dRAM described above is disclosed in "A 1-Mbit DRAM with 33-MHz Serial I/O Ports", K. Ohta, et al., IEEE J. Solid State Circuits Vol. sc-21 No. 5 Oct. 1986 pp. 649-654. In this dRAM, data for one row is output in accordance with an operation of the shift register, for a cycle determined on the basis of an operation speed of the shift register. More specifically, the dRAM has a high-speed access function which is effective for access only in the column direction on an address plane.

This dRAM, however, has the following problems. In an image memory used in graphic display, pattern recognition, and the like, high-speed access function is required not only in the column direction but also in row and oblique directions. In the conventional dRAM, a series of circuit operations in the row direction, such as raising of word lines, bit line sense restore, falling of word lines, and bit line precharge, have been required. Therefore, the high-speed access function in the row and oblique directions cannot be achieved.

SUMMARY OF THE INVENTION

It is an object of the present invention to provide a dRAM which can access at a high speed in vertical, horizontal, and oblique directions on a memory address plane.

According to the dRAM of the present invention, memory cell arrays are divided into a plurality of blocks. The plurality of memory blocks are, e.g., $2^m$ blocks selected by lower row address (e.g., mth bit from the LSB). Word lines selected by row addresses adjacent on a logical address plane are located in the blocks which are different from each other. When memory cells in row i of the logic address are to be accessed, a means for simultaneously raising the word lines of rows $i, i\pm 1, i\pm 2, \ldots,$ and $i\pm j$ $(j<m)$ is arranged. In addition, a means for enabling corresponding ones of sense amplifiers of the blocks including the given word lines is also arranged. The selected data of the memory cells are latched in the sense amplifiers.

According to the present invention, when a given row address is selected on the logical address plane, the data of the plurality of row addresses adjacent to the selected row address are always accessable. In other words, the word lines are raised and the sense amplifiers are enabled. Therefore, high-speed serial access can be performed not only in the column direction but also in the row and oblique directions. A logical address plane is one as shown in FIG. 4, in which an address is expressed in a two dimensional form.

BRIEF DESCRIPTION OF THE DRAWINGS

Other objects and advantages will be apparent from the following description taken in conjunction with the accompanying drawings, in which:

FIG. 3 is a timing chart for explaining an operation of the dRAM of the first embodiment;

FIG. 4 is a view showing direction data corresponding to an address direction of serial access; and FIGS. 5A and 5B are block diagrams of a dRAM according to a second embodiment of the present invention.

DETAILED DESCRIPTION OF THE PREFERRED EMBODIMENT

A dynamic semiconductor memory device according to a first embodiment of the present invention will be described below with reference to FIGS. 1 to 4. In this embodiment, when a given row address is selected on a logical address plane, row address data adjacent to the selected row address are immediately accessable. In other words, when a given block is selected, word lines of blocks adjacent to the selected block are raised, and corresponding ones of sense amplifiers are enabled.

Figure 1:
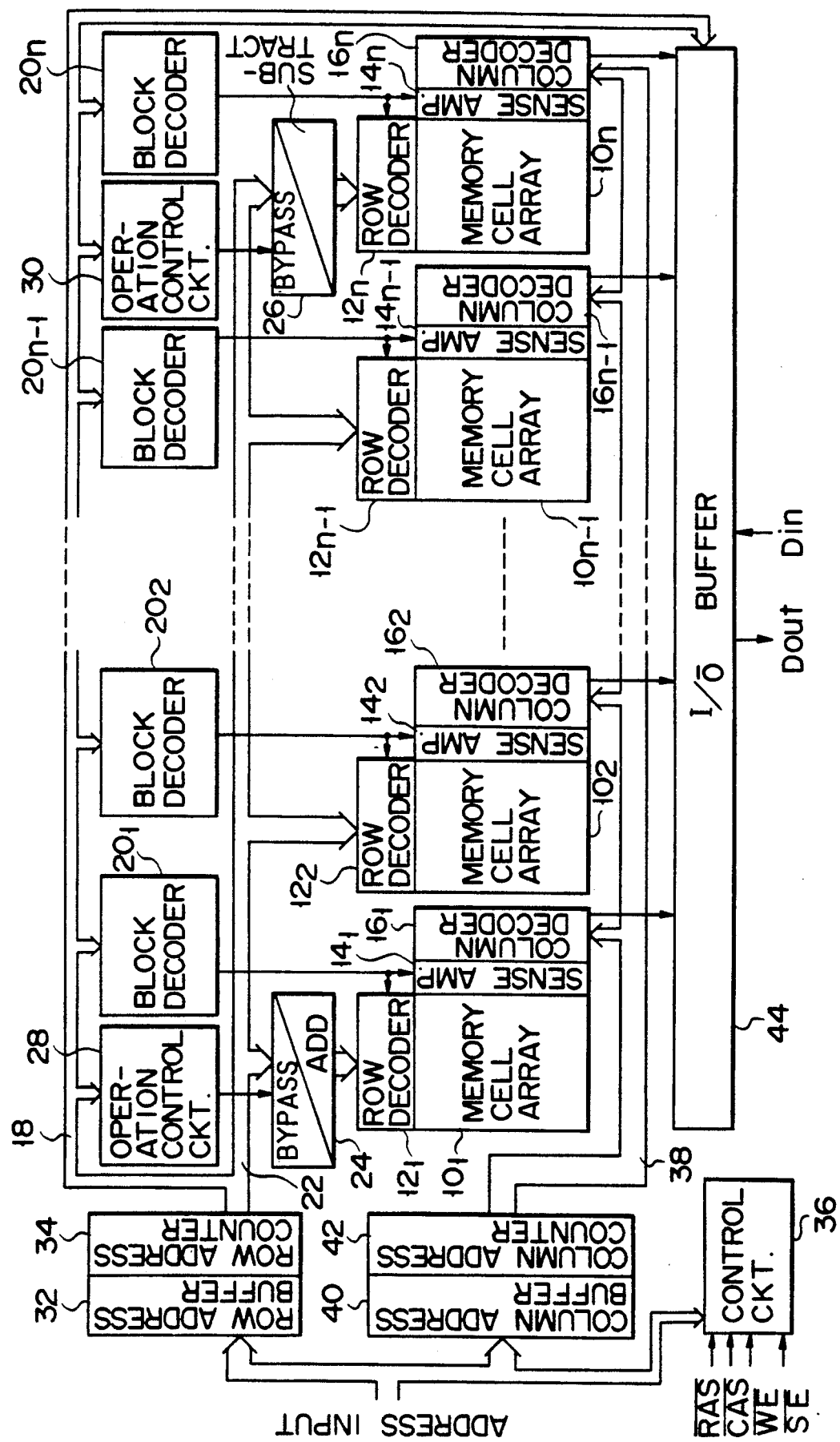
FIG. 1 is a block diagram of a dRAM according to a first embodiment of the present invention.

FIG. 1 shows an arrangement of a dRAM which can serially access at a high speed in various directions. A typical dRAM comprises a plurality of memory cells arranged in a matrix form. An operation of the dRAM is as follows. Word line WL is selected by a row address, and the potential of the selected word line is raised. The data of all the memory cells connected to the selected word line are read out on bit lines BL. Each of the read-out data is amplified by corresponding sense amplifier and latched. Finally, a given bit line is selected by a column address, and only data designated by the column address in the latched data is output.

In such a dRAM according to the embodiment, memory cell arrays of n memory blocks $10_1, 10_2, \ldots, 10_n$ selected by corresponding lower row address data, e.g., a lower row address consisting of the LSB to mth bit are divided in a bit line direction. Word lines selected by row addresses adjacent on the logical address plane are distributed to different memory blocks (memory cell array blocks). Memory blocks $10_1, 10_2, \ldots, 10_n$ include row decoders $12_1, 12_2, \ldots, 12_n$, sense amplifiers $14_1, 14_2, \ldots, 14_n$. and column decoders $16_1, 16_2, \ldots, 16_n$, respectively. Each of memory blocks $10_1, 10_2, \ldots, 10_n$ is enabled by corresponding one of block decoders $20_1, 20_2, \ldots, 20_n$ on the basis of lower row address 18. Remaining upper row address 22 is input to row decoders $12_1$, $12_1$, ..., $12_n$, and a word line is selected by upper row address 22.

Operation circuit 24 is arranged between a row address bus and row decoder $12_1$ connected to first block $10_1$ selected by lower row address 18 of all "0"s. Operation circuit 26 is arranged between the row address bus and row decoder $12_n$ connected to nth block $10_n$ selected by lower row address 18 of all "1"s.

Operation circuit 24 has a function for bypassing the data from the address bus and a function for outputting the address data obtained by adding "1" to the data from the address bus. These functions are switched by operation control circuit 28. More specifically, when the data of lower row address 18 coincides with the data for selecting nth block $10_n$ (1, 1, ..., 1), the adding function is selected, and except that, the bypass function is selected. In other words, according to the "+1" function, when nth block $10_n$ is selected and enabled, the word line having the larger address by "1" than the address of nth block $10_n$ in first block $10_1$ is raised.

Operation circuit 26 has a bypass function and a "−1" function. These two functions are controlled by operation control circuit 30. When lower row address 18 coincides with the data for selecting first block $10_1$ (0, 0, ..., 0), the subtracting ("−1") function is selected. When lower row address 18 does not coincide with the above data, the bypass function is selected. According to the subtracting function, when first block $10_1$ is selected, the word line in nth block $10_n$, which is at the smaller address by "1" than the address of the word line in the first block, is raised.

Lower and upper row addresses 18 and 22 are given as follows. Row address buffer 32 receives an address signal input from an external terminal as an initial value. The initial value is counted up or down by row address counter 34 in response to a serial access control signal input from control circuit 36. Therefore, lower and upper row addresses 18 and 22 are given. Note that the above serial access control signal represents a control signal for setting a serial access mode.

Similarly, column address 38 is given as follows. Column address buffer 40 receives an address signal input from the external terminal as an initial value. The initial value is counted up or down by column address counter 42 in response to a serial access control signal input from control circuit 36. Therefore, column address 38 is given.

Note that reference numeral 44 denotes an I/O buffer.

When lower row address 18 represents the selected address of the block, the address which is obtained by adding "1" to the selected address, and the address which is obtained by subtracting "1" from the selected address, block decoders $20_1$, $20_2$, ..., $20_n$ output block enable signals for enabling the blocks corresponding to the above addresses, respectively. For example, when block $10_2$ is selected, block decoders $20_1$, $20_2$, and $20_3$ output block enable signals, and blocks $10_1$, $10_2$, and $10_3$ are enabled. Note that a block selection address of block $10_1$ is larger by "1" than that of block $10_n$. Block decoders $20_1$, $20_2$, ..., $20_n$ output block enable signals, and then keep enabling the block enable signals during a difference between lower row address 18 and the block selection address is less than $|\pm 3|$.

Figure 2:
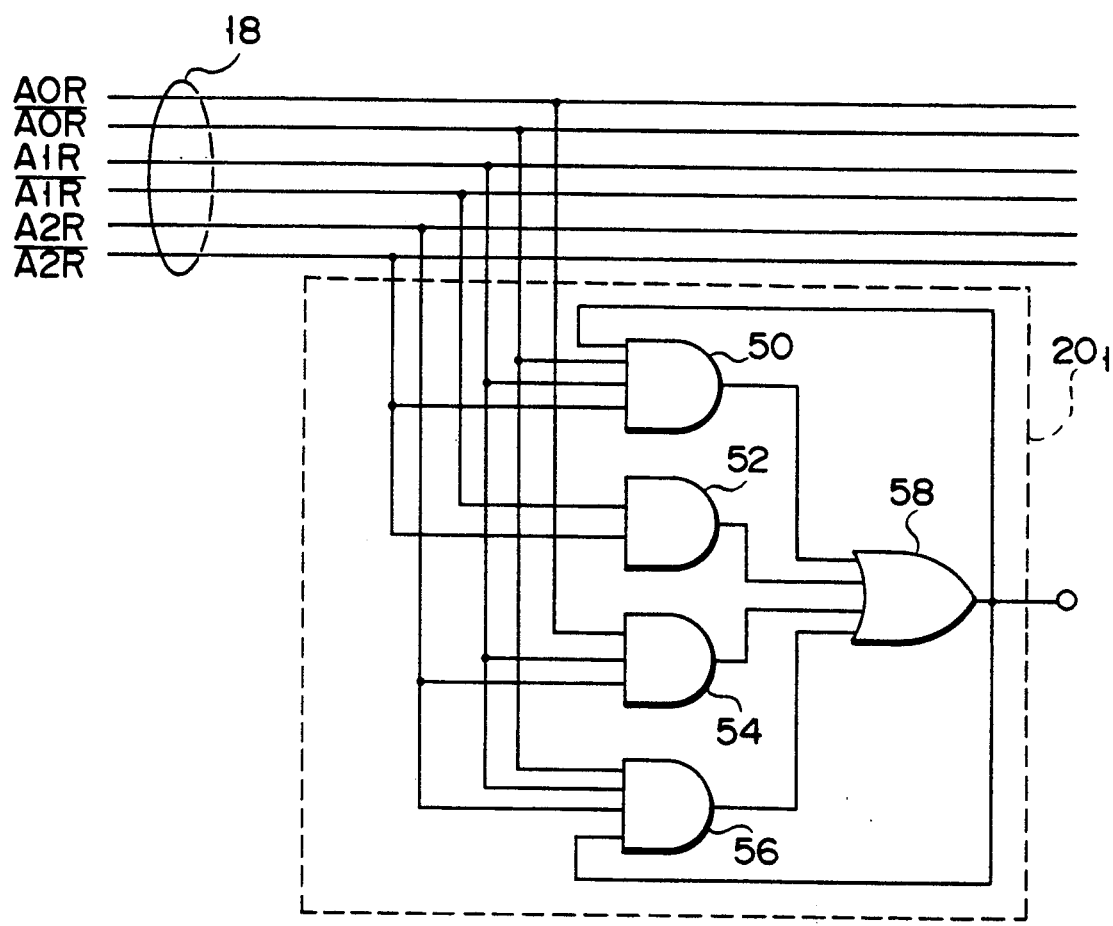
FIG. 2 is a logic circuit diagram showing an arrangement of a block decoder of the first embodiment.

FIG. 2 shows a circuit arrangement of block decoder $20_1$ when lower row address 18 is a 3-bit (m=3) address. When lower row address 18 is (0, 0, 0), the first block is selected. AND gates 52 and 54 detect cases wherein lower row address 18 represents the selected address of the block, the address which is larger than the selected address by "1", and the address which is smaller than the selected address by "1". More specifically, AND gates 52 and 54 detect that addresses $(A_{2R}, A_{1R}, A_{0R})$ represent (0, 0, 0), (0, 0, 1), and (1, 1, 1). After a block enable signal is output and an output of OR gate 58 is set at "H" level, AND gates 50 and 56 keep enabling the output of OR gate 58 at "H" level during a difference between the data of lower row address 18 and the selected address of the block is less than $|\pm 3|$. In other words, even if lower row addresses $(A_{2R}, A_{1R}, A_{0R})$ represent (0, 1, 0), (1, 1, 0), (0, 0, 1), or (1, 1, 1), the output from OR gate 58 is kept at "H" level. By keeping "H" level as described above, even if the memory cell is selected in the reverse direction, the reset time can be sufficiently assured. A forward direction is a direction in which a counter is incremented. A reverse direction is a direction of decrementation.

FIG. 3 is a timing chart for explaining an embodiment of a detailed serial access operation of the dRAM having the above arrangement. First, an external row address is input at trailing edge 60 of $\overline{RAS}$ (row address strobe) in the same manner as in the conventional dRAM. A complementary signal is generated by row address buffer 32. The complementary signal is transferred to row address counter 34 and latched. Word line WL is started to be enabled in response to output data from counter 34, i.e., upper row address 22 and lower row address 18. When input lower row address 18 represents (0, 0, ..., 0), i.e., the address of first block $10_1$, blocks $10_1$, $10_2$, and $10_n$ are simultaneously enabled by corresponding block decoders $20_1$, $20_2$, and $20_n$. Therefore, the word lines in these three blocks which are selected by upper row address 22 are enabled. In this case, as described above, operation circuit 26 in block $10_n$ is operated as a subtractor. The word line selected by the address obtained by subtracting "1" from a value represented by upper row address 22 is enabled. At the leading edge of a timing pulse, sense amplifiers $14_1$, $14_2$, and $14_n$ in the above three blocks are simultaneously enabled.

A column address is input at a trailing edge of $\overline{CAS}$ (column address strobe), and a complementary signal is generated by column address buffer 40. The complementary signal is transferred to column address counter 42 and latched. Output 38 from column address counter 42 is transferred to column decoders $16_1$, $16_2$, ..., $16_n$ through a column address bus to select the columns. The readout data is latched by I/O buffer 44. Then, only the data of block $10_1$ is output to output terminal $D_{OUT}$.

At this time, all the memory cells connected to three word lines including two adjacent rows on the logical address plane can be immediately accessed. More specifically, the sense amplifiers are enabled and all the memory cells can be read out and written at any time.

When serial access enable signal $\overline{SE}$ is set at "L" level, and $\overline{CAS}$ is given as a synchronization signal, a dRAM according to the present invention performs a serial access operation as follows. Direction data to be accessed is input at leading edge 62 of $\overline{CAS}$. By using e.g., three address pins, the direction data can be input as 3-bit data as shown in FIG. 4. On the basis of the direction data, row address counter 34 and column address counter 42 are counted up or down to update the lower address data. At this time, if a block access is shifted in the row direction, a new block must be enabled, i.e., the word line and the sense amplifier are enabled and the previous block is reset and precharged. More specifically, as shown in FIG. 3, when block $10_2$ is accessed by an address obtained by adding "1" to the address in the row direction at leading edge 62 of $\overline{CAS}$, next block $10_3$ is enabled. At the same time, the data in I/O buffer 44 is switched, and the data of block $10_2$ is output at trailing edge 64 of $\overline{CAS}$. When the row address is changed and blocks are selected in an order of $10_2 \rightarrow 10_3 \rightarrow 10_4 \rightarrow 10_3 \rightarrow 10_2 \rightarrow 10_1$, the serial access is performed, as shown in FIG. 3. Similarly, the column address can be switched in arbitrary directions.

In this embodiment as described above, the block which may be accessed during the following cycle is kept enabled before one cycle or more. Therefore, the high-speed serial access in the arbitrary directions can be performed. However, in the dRAM, it takes time until restore of the cell data is completed after the sense amplifier is enabled, and until the word line falls and the bit line is precharged. Therefore, in order to realize the bidirectional scan, a timing of precharge operation of the enabled blocks is important. In this embodiment, the enabled block is precharged when the access block is apart from the enabled block by three blocks. For example, as shown in FIG. 3, block $10_1$ is precharged at leading edge 68 of $\overline{CAS}$ for receiving an access signal from block $10_4$. As a result, until block $10_1$ is started to be precharged and enabled again, at least an interval of two cycles of $\overline{CAS}$, i.e., can be assured, the interval until leading edge 70 of $\overline{CAS}$. During this interval, a precharge operation can be sufficiently completed. In this embodiment, as can be apparent from FIG. 3, memory cell arrays are divided into at least six blocks, so that the memory cells can be serially accessed for ¼ cycle of the $\overline{RAS}$ cycle time of the conventional dRAM in the arbitrary directions including the row direction.

Although a reading operation has been described above, high-speed serial access can be similarly performed for a writing operation.

Figure 5A:
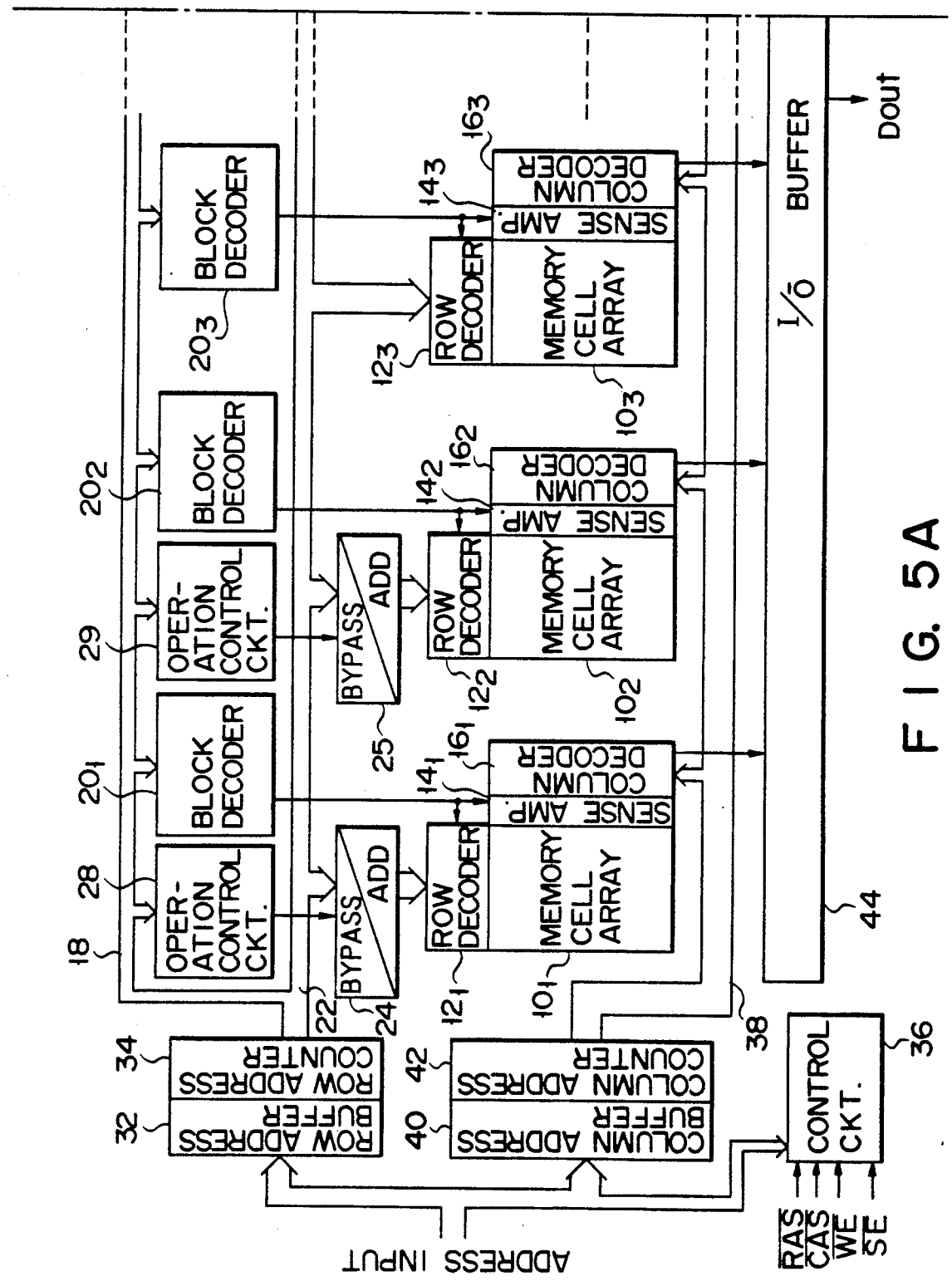

A dRAM according to a second embodiment of the present invention will be described below with reference to FIGS. 5A and 5B. In the arrangement of the dRAM according to this embodiment, when a predetermined memory block is selected by a predetermined lower row address, four memory blocks are simultaneously enabled. Four memory blocks are respectively designated by the addresses which are larger than the lower row address by "1" and "2", and the addresses which are smaller than the lower row address by "1" and "2". Block decoders $20_1$, $20_2$, $20_3$, ..., $20_{n-2}$, $20_{n-1}$, and $20_n$ are arranged to obtain the above functions. In addition, operation control circuit 28 and operation circuit 24 are arranged for block $10_1$, and operation control circuit 29 and operation circuit 25 are arranged for block $10_2$. Operation control circuit 31 and operation circuit 27 are arranged for block $10_{n-1}$, and operation control circuit 30 and operation circuit 26 are arranged for block $10_n$. The functions of operation control circuits 28, 29, 30, and 31, and those of operation circuits 24, 25, 26, and 27 are the sam as those in the first embodiment. Since other parts in the second embodiment are the same as those in the first embodiment, the same reference numerals as in the first embodiment denote the same parts in the second embodiment, and a description thereof will be omitted.

The preferred invention is not limited to the above embodiments. In the above embodiments, a CAS pin is used as a serial access sync clock pin. However, if spare pins of the package are available, a serial access sync clock pin may be provided. An address shift signal is not limited to an input from the address pin, and may be input from the serial access sync clock pin. In the above embodiments, the address shift signal is input at a leading edge of $\overline{CAS}$ serving as the serial access sync clock signal. However, if the access time is sufficiently long, the signal may be input at a trailing edge of $\overline{CAS}$ in the same manner as in a trigger of data output $D_{OUT}$. In the above embodiments, a column access is shifted in a column direction by only one bit. However, the column address counter may be changed or the column addresses may be input from an external area every time, so that the arbitrary columns can be selected in the same row. In addition, a shift register is arranged in the column direction, so that higher-speed serial access can be performed in the column direction. Regarding the row direction, the number of block divisions is increased and the number of blocks simultaneously enabled is also increased, thereby achieving higher-speed access. In addition, time for keeping the enable states of the enabled blocks, i.e., the time interval between the enabled block and the selection block for waiting for precharge is increased, thereby realizing higher-speed access.

What is claimed is:

1. A dynamic semiconductor device in which blocks of memory cells are accessed for outputting data stored in the memory cells during a serial access cycle comprising:

a dynamic random access memory divided into a plurality of separate blocks of memory cells arranged in matrix form, each block having word lines addressable by row addresses and bit lines addressable by column addresses;

row addressing means for addressing a selected row of each of the blocks in response to a specified row address wherein the row addressing means is connected to each of the blocks, and for outputting lower row addresses for respectively designating blocks in which the selected row and a row adjacent to the selected row are located and upper row addresses for respectively designating the selected row and the row adjacent to the selected row in response to the specified row address;

columns addressing means for addressing a selected column of each of the plurality of blocks in response to a specified column address signal;

a sense amplifier group comprising a plurality of sense amplifiers connected to each of the blocks wherein the number of said sense amplifiers is equal to the number of bit lines in each block, the bit lines of each of the blocks being connected to a corresponding one of the sense amplifiers;

activation means for activating the sense amplifier group and row addressing means of a selected one of said blocks, and also the sense amplifier groups and row addressing means of two additional blocks adjacent to said selected block, one of said adjacent blocks being an upper row block and the other of said adjacent blocks being a lower row block with respect to said selected block, said sense amplifier groups and row addressing means of each block being activated simultaneously in order to set said activated blocks into a stand-by state wherein said activated blocks in the stand-by state are ready to output data upon receiving said specified column address signal from said column addressing means; and activation maintaining means for maintaining said activated blocks in said stand-by state ready to output said data for a predetermined time period such that when said selected block begins to be activated, and is in a precharging period, said upper block is already in a fully activated state due to the activation maintaining means maintaining the upper row block in said stand-by state for said predetermined time period, and whereby said lower row block has not yet started to be activated but will be in a fully activated state before said selected block is started to be deactivated.

2. The dynamic semiconductor device according to claim 1, wherein a first selected word line in said selected block and a second selected word line in one of said adjacent blocks are designated by said row addressing means.

3. The dynamic semiconductor device according to claim 1, further comprising:
means for receiving an address signal input from an external terminal as an initial value of said specified row address; and
a row address counter for counting up or down row addresses in response to a serial access control signal.

4. The dynamic semiconductor device according to claim 1, further comprising:
a column address counter for receiving an initial value from an external terminal.

5. The dynamic semiconductor device according to claim 1, further comprising:
row and column address counters each for counting up or down address data corresponding to a plurality of bits input to an external terminal as direction data of serial accessing.

6. The dynamic semiconductor device according to claim 1, wherein a control signal for serial accessing is generated at a leading edge of a column address strobe signal.

7. The dynamic semiconductor device according to claim 1, wherein when one of said adjacent blocks is activated, a specified sense amplifier group is deactivated in order to thereby deactivate the block corresponding to said specified sense amplifier group.

* * * * *